US008726498B2

(12) United States Patent
Pai et al.

(10) Patent No.: US 8,726,498 B2
(45) Date of Patent: May 20, 2014

(54) METHODS FOR FILLING HOLES IN PRINTED WIRING BOARDS

(75) Inventors: Deepak Keshav Pai, Burnsville, MN (US); Chris H. Simon, Minneapolis, MN (US)

(73) Assignee: General Dynamics Advanced Information Systems, Fairfax, VA (US)

( * ) Notice: Subject to any disclaimer, the term of this patent is extended or adjusted under 35 U.S.C. 154(b) by 235 days.

(21) Appl. No.: 12/805,753

(22) Filed: Aug. 18, 2010

(65) Prior Publication Data

US 2011/0067235 A1    Mar. 24, 2011

Related U.S. Application Data

(63) Continuation of application No. 10/765,201, filed on Jan. 28, 2004, now Pat. No. 7,802,360.

(60) Provisional application No. 60/443,168, filed on Jan. 29, 2003.

(51) Int. Cl.
*H01K 3/10* (2006.01)

(52) U.S. Cl.
USPC ............. 29/852; 29/846; 29/847; 174/266; 427/97.2; 427/97.7

(58) Field of Classification Search
USPC ............ 29/846, 847, 852; 174/266; 427/97.2, 427/97.7
See application file for complete search history.

(56) References Cited

U.S. PATENT DOCUMENTS

| | | | | |
|---|---|---|---|---|
| 3,589,004 A | * | 6/1971 | Shaheem | 29/847 |
| 5,108,553 A | * | 4/1992 | Foster et al. | 205/125 |
| 6,239,386 B1 | * | 5/2001 | DiStefano et al. | 174/262 |

* cited by examiner

*Primary Examiner* — Peter DungBa Vo
*Assistant Examiner* — Jeffrey T Carley
(74) *Attorney, Agent, or Firm* — Ingrassia, Fisher & Lorenz, PC

(57) ABSTRACT

The invention comprises methods for filling holes in printed wiring boards and printed wiring boards produced by these methods. The methods involve plating metal conductors inside the holes of the printed wiring boards while protecting the conducting surfaces of the printed wiring boards from being plated using photoresist film. The side surfaces of a printed wiring board are covered with photoresist. The photoresist is exposed to developing light, except the photoresist covering the holes on one side of the board is masked to prevent exposure of the holes to the developing light. The undeveloped photoresist covering the holes is removed. The board is subjected to a plating process, which deposits conductive materials in the holes, but the photoresist on the conducting surfaces of the board prevents conductive materials to be plated on the surfaces of the board.

5 Claims, 1 Drawing Sheet

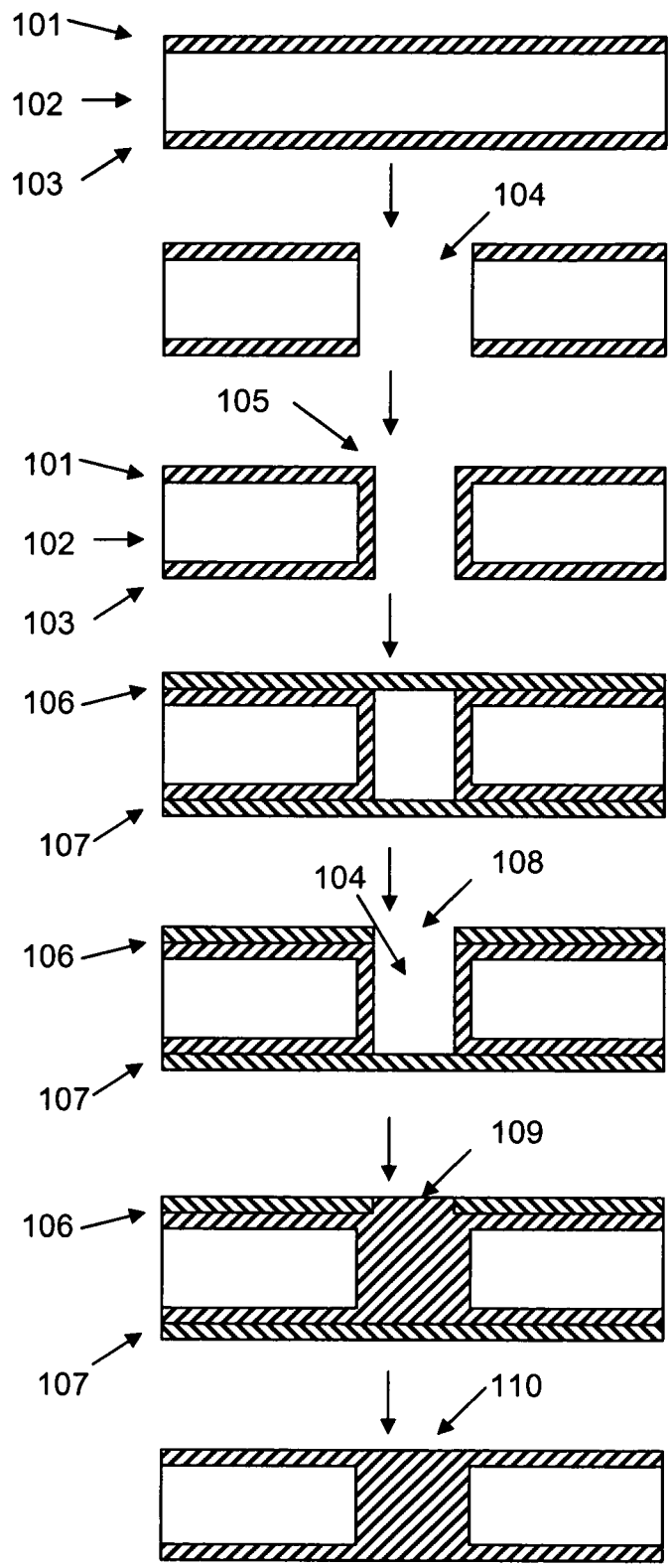

METHODS FOR FILLING HOLES IN PRINTED WIRING BOARDS

CROSS REFERENCE TO RELATED APPLICATIONS

The present application is a continuation of U.S. application Ser. No. 10/765,201, filed Jan. 28, 2004, which claims the benefit of U.S. Provisional Application No. 60/443,168, filed Jan. 29, 2003, the disclosure of which is expressly incorporated herein by reference in its entirety.

BACKGROUND OF THE INVENTION

Printed wiring boards (PWBs) are used as platforms for most electronic circuits. They serve as bases for electronic components such as integrated circuit chips, resistors, capacitors, and other familiar circuit elements. PWBs provide the actual physical base for mounting these electronic components, as well as the electrical connections required between the components. PWBs typically consist of a non-conductive dielectric layer, usually epoxy resin coated fiberglass, and a conductive layer, usually copper or some other metal.

To prepare a PWB, the conductive layer is subjected to a set of processes by which much of the conducting metal is removed from the non-conductive substrate, leaving behind a pattern of conductor that provides the proper electrical connections between the electronic components that are ultimately mounted to the PWB (i.e., the circuit pattern). In a photolithography process, the metal layer of the PWB is coated with a light-sensitive photoresist material. A mask is used to create a pattern in the photoresist layer by exposing only those parts of the conducting layer that will comprise the circuit pattern. The PWB is then subjected to ultraviolet developing light. The photoresist material that is on the exposed parts of the PWB, those parts not obscured by the mask, polymerizes on exposure to the ultraviolet light. Next, the mask is removed and the unpolymerized photoresist material is washed off, leaving exposed conductive layer in those parts blocked by the mask, but leaving a layer of polymerized photoresist material over the conductive layer of those parts that were not blocked by the mask. Finally, the PWB is etched in a process wherein the PWB is exposed to an etchant (e.g., cupric chloride, ammoniacal, or sulfuric peroxide). The etchant removes the exposed conductive layer, but leaves the parts of the conductive layer that are protected by the polymerized photoresist.

Modern PWBs often have rather dense circuitry. To accommodate the need for high density circuits, manufacturers have assembled layers of PWBs into multiple layer PWBs, typically with unique circuitry in each layer. These assemblies are typically comprised of alternating layers of PWBs and non-conducting dielectric layers such as epoxy resin coated fiberglass. Epoxy resin is typically the medium used to bind the layers into a single unit.

Multiple layer PWBs require electrical connections not only within each PWB, which is accomplished by photoresist etching as described above, but they also require electrical connections between layers in order to interconnect circuitry on different layers. For example, in a two-layered PWB, with two conductive layers separated by a layer of dielectric, the most efficient use of the PWB area is to allow circuits to span across the two conducting layers. This is typically achieved by drilling holes in the predetermined appropriate places on the multilayered PWB, then depositing a metal on the inside of the holes. The drilling step has become quite sophisticated, and often involves drilling extremely small holes on the order of a hundredth of an inch or smaller. After the drilled hole has been appropriately cleaned by removal of any material at the mouth of the hole, the hole is subjected to a process that makes it conductive. This may involve a non-electrolytic deposition of metal on the inside of the hole, followed by electroplating to the desired thickness, although many other alternative methods of depositing conductor in holes are also used.

When the holes in multi-layered PWBs have been rendered conductive, the deposited metal only coats the surface of the holes, thus effectively creating a hollow cylinder of conductive material. If the number of holes in a PWB is great enough, they can cause the PWB to become quite fragile even after the metal deposit. To reinforce the PWB, the holes may be filled with epoxy resin. Epoxy resin filling was commonly used for relatively large holes, i.e., holes with diameters of greater than about 0.020 inches, with relatively small aspect ratios (the ratio between the length of the hole to its diameter) where small aspect ratios are less than about 7. However, the modern trend has been towards smaller holes with greater aspect ratios, and these smaller holes have become almost impossibly difficult to fill with resin.

There is an ever present need in this art for better methods for filling holes in multi-layered PWBs. There is a particular need for methods for filling small holes with large aspect ratios in multi-layered PWBs.

SUMMARY OF THE INVENTION

The present invention provides methods for filling holes in multi-layered PWBs. The method is particularly useful for filling small holes (less than 0.02 inches in diameter) with large aspect ratios (greater than about 7) in multi-layered PWBs.

In one aspect, the invention includes a method for filling at least one hole in a PWB. A photoresist material may be applied to both sides of a multi-layered PWB and the PWB may be exposed to developing light, but the developing light may be blocked and prevented from developing the photoresist material that covers the openings of the holes on at least one side of the PWB. In one embodiment, the photoresist material covering the openings of the holes on both sides of the PWB may be blocked. The PWB may be washed to remove the unexposed photoresist material covering the openings of the holes.

The inner surfaces of the holes may be plated with a conductor. The photoresist material on the surfaces of the PWB may substantially prevent the surfaces of the PWB from being plated with the conductor. In one embodiment of the invention, the conductor plated on the inner surfaces of the holes is copper. In another embodiment, the plating step is performed by electroplating. This method may be used to completely fill holes with conductor, it may be used to substantially fill the hole with conductor (that is when the conductor deposit occupies more volume of the hole than empty space), or it may be used simply to plate the inner surface of the hole with conductor.

This method may be used to fill any hole, but is particularly useful where other hole filling technologies fail, that is where the diameter of the hole to be filled is less than about 0.02 inches, particularly where the diameter of the hole to be filled is less than about 0.01 inches, or where the aspect ratio of the hole to be filled is greater than about 7, particularly where the diameter of the hole to be filled is greater than about 10.

In another aspect, the invention includes PWBs with holes that are filled by the method described above. In particular, the invention includes a PWB with a filled hole, wherein the hole was drilled by any means known to those skilled in the art, including but not limited to mechanical drilling, punching, and laser drilling. Both sides of the PWB may be covered with photoresist, and on one side, those parts of the photoresist covering the holes may be blocked from exposure to developing light and the remainder of the photoresist may be exposed to developing light. In an alternative embodiment, those parts of the photoresist covering the holes may be blocked from exposure to developing light on both sides of the PWB. The PWB may be washed to remove the unexposed photoresist material covering the openings of the holes. The inner surface of the holes may be plated with a conductor without exposing the surfaces of the PWB to be plated. The holes in the PWBs of the invention may be completely filled, substantially filled, or plated using the method of the invention.

The invention includes PWBs with any size holes that have been filled using this method, but the invention particularly includes PWBs with holes less than 0.02 inches in diameter, even more particularly with holes less than 0.01 inches in diameter, and holes with aspect ratios greater than 7, and more particularly with aspect ratios greater than 10.

In yet another aspect, the invention includes an apparatus for the manufacture of PWBs with holes filled by the method described above. The apparatus may include a means for applying photoresist material to a PWB and a means for developing the photoresist on particular parts of the PWB not covering holes in the PWB to be plated. The apparatus may further include a means for washing the board to remove the unexposed photoresist material covering the holes to be plated and a means for plating the hole with a conductor.

DESCRIPTION OF THE DRAWING

FIG. 1 shows the basic steps in one method of the invention.

DETAILED DESCRIPTION

The invention includes methods for filling holes in PWBs, PWBs manufactured by these methods, and a manufacturing apparatus for manufacturing PWBs by these methods.

FIG. 1 shows the results on a two-layer PWB following each of the steps of the method. FIG. 1A shows a two-layer PWB with a first copper layer 101, a dielectric layer 102, and a second copper layer 103. While copper is being used for purposes of describing this embodiment, in alternative embodiments any conductor may be used, including, but not limited to, gold, silver, and zinc.

FIG. 1B shows the two-layer PWB with a hole 104 drilled through it. The hole 104 may be drilled using any method known to those in the art for producing holes in PWBs including, but not limited to, mechanical drilling, punching, and laser drilling.

FIG. 1C shows the two-layer PWB after the inner surface of the hole has been plated with copper 105. This plating step may be accomplished using any method known to those skilled in the art for depositing a conductor in holes. In one embodiment, this plating step is accomplished by connecting both surfaces of the PWB to an electrode and electroplating the inner surface of the hole.

FIG. 1D shows the two-layer PWB after a layer of photoresist film has been applied to the top surface 106 and the bottom surface 107 of the PWB. The photoresist film preferably covers the entire top and bottom surfaces of the PWB in order to protect these surfaces from being plated in subsequent steps.

FIG. 1E shows the two-layer PWB after the photoresist film has been exposed to developing light, and the undeveloped photoresist film over the hole in the PWB has been removed, leaving a hole in the photoresist film 108 directly over the opening of the hole 104 in the PWB. In one embodiment, the hole in the photoresist film 108 is only on the top side of the PWB 106. In alternative embodiments, there may additionally be a hole in the photoresist film on the bottom side of the PWB 107.

FIG. 1F shows the two-layer PWB after the hole has been filled with copper 109. The photoresist film on the top 106 and bottom 107 of the PWB prevent additional copper from being deposited on the top and bottom surfaces of the PWB, although a nodule of copper 109 may rise above the top surface of the PWB.

FIG. 1G show the completed two-layer PWB after the hole has been filled with copper, the top surface has been planarized, and the photoresist film has been removed from the top and bottom surfaces of the PWB.

What is claimed is:

1. A method for filling a hole in a printed wiring board, comprising:
   providing the printed wiring board comprising: an insulating layer having a first surface and a second surface opposite the first surface, a first conductive layer disposed overlying the first surface, the first conductive layer having a bottom surface facing the first surface and an upper surface opposing the bottom surface, and a second conductive layer overlying the second surface, wherein the insulating layer is disposed between the first conductive layer and the second conductive layer;
   drilling the hole that extends through the printed wiring board, wherein the hole defines an inner surface;
   plating a first conductive material over the inner surface;
   after plating the first conductive material over the inner surface:
      then applying photoresist directly overlying: the first conductive material, an area above the hole and the upper surface of the first conductive layer;
      then removing a portion of the photoresist that directly overlies the area above the hole, and leaving other remaining portions of the photoresist directly overlying other portions of the upper surface of the first conductive layer; and
      then substantially filling the hole with a second conductive material such that the second conductive material is electrically connected to portions of the first conductive layer that are not covered by the other remaining portions of the photoresist that directly overlie the other portions of the upper surface of the first conductive layer, wherein the other remaining portions of the photoresist that directly overlie the other portions of the upper surface of the first conductive layer substantially prevent the second conductive material from adhering to the other portions of the upper surface of the first conductive layer during the filling of the hole with the second conductive material.

2. The method of claim 1, wherein the plating comprises applying an electrical potential between the first and second conductive layers of the printed wiring board.

3. The method of claim 1,
   wherein drilling the hole that extends through the printed wiring board comprises:
   drilling the hole that extends concentrically through the printed wiring board.

4. The method of claim 1, further comprising:
planarizing the second conductive material to leave remaining portions of the second conductive material.

5. The method of claim 4, further comprising:
then removing other remaining portions of the photoresist, wherein the portions of the first conductive layer remain electrically connected to the remaining portions of the second conductive material after the other remaining portions of the photoresist have been removed.

\* \* \* \* \*